US006569747B1

(12) United States Patent
Achuthan et al.

(10) Patent No.: US 6,569,747 B1
(45) Date of Patent: May 27, 2003

(54) METHODS FOR TRENCH ISOLATION WITH REDUCED STEP HEIGHT

(75) Inventors: Krishnashree Achuthan, San Ramon, CA (US); Kashmir Sahota, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/105,178

(22) Filed: Mar. 25, 2002

(51) Int. Cl.[7] ............................................. H01L 21/76
(52) U.S. Cl. ..................... 438/424; 438/692; 438/756
(58) Field of Search ................................ 438/424, 435, 438/691–693, 756

(56) References Cited

U.S. PATENT DOCUMENTS

| 5,229,316 | A |   | 7/1993  | Lee et al.      |         |
|-----------|---|---|---------|-----------------|---------|
| 5,674,773 | A |   | 10/1997 | Koh et al.      |         |
| 5,692,950 | A |   | 12/1997 | Rutherford et al.|        |
| 5,923,993 | A |   | 7/1999  | Sahota          |         |
| 5,950,093 | A |   | 9/1999  | Wei             |         |
| 5,998,301 | A |   | 12/1999 | Pham et al.     |         |
| 6,004,862 | A |   | 12/1999 | Kim et al.      |         |
| 6,037,236 | A |   | 3/2000  | Jang            |         |
| 6,069,080 | A |   | 5/2000  | James et al.    |         |
| 6,080,635 | A |   | 6/2000  | Jang et al.     |         |
| 6,190,999 | B1| * | 2/2001  | Hung et al.     | 438/424 |
| 6,217,418 | B1|   | 4/2001  | Lukanc et al.   |         |
| 6,337,281 | B1|   | 1/2002  | James et al.    |         |
| 6,355,540 | B2| * | 3/2002  | Wu              | 438/424 |

OTHER PUBLICATIONS

"Improved Planarization for STI with Fixed Abrasive Technology", Tuyen Vo, Todd Buley, Rodel Inc., Phoenix Arizona; John J. Gagliardi, 3M Corp., St. Paul, Minnesota—Solid State Technology, A PennNet Publication, vol. 43, Issue 6, Jun. 2000, pp. 123–128.

* cited by examiner

*Primary Examiner*—Wael Fahmy, Jr.
*Assistant Examiner*—Anh Duy Mai
(74) *Attorney, Agent, or Firm*—Eschweiler & Associates, LLC

(57) ABSTRACT

Shallow trench isolation techniques are disclosed in which a nitride layer is formed on a semiconductor substrate, and a trench is formed through the nitride layer and into the semiconductor substrate. The nitride layer is removed prior to filling the isolation trench, and the fill material is planarized using a fixed-abrasive CMP process to mitigate or avoid step height in the shallow trench isolation process.

17 Claims, 6 Drawing Sheets

METHODS FOR TRENCH ISOLATION WITH REDUCED STEP HEIGHT

FIELD OF INVENTION

The present invention relates generally to semiconductor device fabrication and more particularly to improved trench isolation techniques for manufacturing semiconductor devices.

BACKGROUND OF THE INVENTION

Integrated circuits are fabricated by forming electrical devices on or in a semiconductor substrate and interconnecting these devices to form electrical circuits. In the design and manufacture of such semiconductor devices, it is necessary to isolate the individual electrical devices from one another, for example, to avoid parasitic transistor operation in adjacent MOSFET devices. Thusfar, a variety of techniques have been developed for electrically isolating devices in integrated circuit fabrication. One such technique is known as local oxidation of silicon (LOCOS), which involves selectively growing oxide in non-active or field regions of a substrate using a nitride mask overlying active regions thereof. However, as device geometries have been reduced beyond submicron sizes, conventional LOCOS isolation technologies have become ineffective, due to bird's beak and other shortcomings. Accordingly alternate isolation processes for CMOS and bipolar technologies have been developed for semiconductor devices such as logic and/or memory. One such technique includes shallow trench isolation (STI), in which isolated trenches are provided vertically into the substrate, which are then filled with electrically isolating materials such as silicon dioxide ($SiO_2$). The resulting (e.g., filled trench) isolation structures separate and provide electrical isolation between electric devices such as transistors and/or memory cells subsequently formed on either side of the trench.

Electrical devices, such as transistors and memory cells are formed in a series of process steps, including the patterning process steps by which circuit patterns are transferred onto the surface layers of semiconductor wafers. Of particular importance is the patterning of polysilicon structures used to form gate contacts in transistor devices, where the gate dimensions are largely determinative of channel length and associated device performance characteristics. In this regard, it is known that patterning accuracy is facilitated by surface flatness. Accordingly it is desirable to provide a smooth, substantially planar surface while patterning a semiconductor wafer, particularly for small dimension patterning in high density devices. Lithographic techniques are employed in patterning semiconductor devices, which involve optically projecting patterns onto the wafer's surface. However, where the surface is not flat, the projected image will be distorted, causing undesirable effects including variance in critical device dimensions, such as transistor channel length corresponding to gate contact dimensions.

Referring to FIGS. 1A–1G, conventional STI processing of a semiconductor wafer 2 is illustrated, beginning in FIG. 1A with a thermal oxidation process to grow a barrier or pad oxide layer 4 (e.g., approximately 200–400 Å thick) over a semiconductor substrate 6. A nitride layer 8 (e.g., $Si_3N_4$) is then deposited in FIG. 1B, such as by low pressure chemical vapor deposition (LPCVD). The nitride layer 8 is used to protect the active regions of the substrate 6 from adverse effects of the subsequent formation of isolation trenches between the active regions. In addition, the nitride layer thickness is increased to allow process control margin for non-self-stopping planarization following trench fill. Thus, the conventional nitride layer 8 is deposited to a thickness of about 2,000 Å, and can include arc layers such as SiN and SiRN. The active regions of the device 2 are then masked in FIG. 1C using a patterned etch mask 10, leaving the isolation region of the nitride layer 8 exposed.

Thereafter an etch process 12 is employed to etch through the nitride layer 8, the pad oxide 4, and into the substrate 6 to form a trench 14 in the exposed isolation region. As illustrated in FIG. 1D, the active mask 10 is removed and a liner 16 is formed in the trench 14, such as through thermal oxidation of the exposed portions of the trench 14, in order to remove damage from the silicon etch process 12. $SiO_2$ or other fill material 18 is then deposited in FIG. 1E to fill the trench 14 and also to cover the active substrate regions, which is done using a deposition process 20. A wafer surface planarization process 22 is thereafter performed in FIG. 1F, typically through chemical mechanical polishing (CMP). Following planarization, the remainder of the nitride layer 8 is then stripped or removed using an etch process 24 in FIG. 1G, leaving a step having a height 26 generally equal to the post-CMP thickness of the removed nitride layer 8. The step height 26 causes inaccuracies in subsequent gate contact formation in the active regions adjacent the trench 14, resulting in variance in the critical gate dimensions.

The CMP processing 22 is a surface planarization operation involving rotation of the silicon wafer 2 against a polishing pad in the presence of an abrasive slurry (not shown) while applying pressure. The polishing pad, generally a polyurethane-based material, includes polymeric foam cell walls, which aid in removal of the reaction products at the wafer interface. The controlled pressure forces the abrasive particles of the slurry into intimate contact with the wafer surface, whereas the velocity of rotation controls mechanical removal rate as the abrasive slurry particles are transported to the wafer surface. However, the conventional CMP 22 is not a self-stopping process. Accordingly, the nitride layer 8 is typically made thicker to allow process margin to prevent the CMP processing 22 from damaging the underlying substrate. Once CMP planarization 22 is completed, the nitride layer 8 is removed and the underlying barrier or pad oxide layer 4 is regrown or reformed to provide a gate oxide layer of predetermined thickness in the active regions. Thereafter, the electrical devices, such as transistors and/or memory cells (not shown) are formed in or on the substrate, and dielectric and connection (metal) layers are processed to interconnect the devices.

During formation of such electrical devices, photo lithographic techniques are used to pattern various features to create structures thereof. For example, etch masks are patterned to define the length of polysilicon gate structures which are etched from a polysilicon layer deposited over the gate oxide layer. However, such photolithography processes are less accurate in the presence of non-planar surface features. One such non-planar surface characteristic is the step resulting from the removal of the nitride layer 8 following CMP planarization 22. In the conventional STI processing described above, the step height 26 of the trench fill material 18, which is the maximum field thickness above the active surface, is largely determined by the thickness of the nitride layer 8 after termination of the CMP polishing 22. However, as noted above, the CMP process 22 is not controllable to a high degree of accuracy, and therefore, the post-CMP nitride layer thickness (and hence the step height 26) may vary greatly. As a result, the corresponding misalignment inaccuracies in the subsequent poly gate patterning are variable as well, leading to undesirable variances in the critical dimensions (CDs) of subsequently formed electrical devices. Thus, there remains a need for improved techniques for isolating electrical devices in semiconductor devices by which these and other critical dimensions may be better controlled by reducing STI related step heights.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later. The present invention advantageously allows reduction or elimination of step heights related to STI isolation in semiconductor devices, by which the above mentioned and other difficulties encountered in the prior art can be minimized or mitigated.

Toward that end, the invention involves shallow trench isolation (STI) techniques by which isolation structure step heights can be reduced or eliminated to improve or facilitate critical dimension (CD) control and/or repeatability in the manufacture of semiconductor devices. A nitride layer is formed on a semiconductor substrate, and a trench is formed through the nitride layer and into the semiconductor substrate. The nitride layer is removed prior to filling the isolation trench, and the fill material is planarized using a fixed-abrasive CMP or other substantially self-stopping process to mitigate or avoid step height in the shallow trench isolation process. The removal of the nitride layer prior to CMP processing allows for planarization to be accomplished without regard to the nitride layer thickness. In this manner, the step height previously associated with the post-CMP nitride layer thickness may be completely eliminated. Furthermore, the employment of advanced self-stopping planarization processes, such as fixed-abrasive polishing techniques allows for reduction in the nitride layer thickness, as this is no longer required to function as a CMP stop layer.

According to one aspect of the invention, a method is provided for fabricating semiconductor devices in a semiconductor substrate, which comprises forming a nitride layer on a semiconductor substrate (e.g., or over a pad oxide layer thereon), forming one or more trenches through the nitride layer and the substrate, and then removing the nitride layer. A liner oxide may optionally be formed in the trenches prior to nitride removal. After the nitride layer is removed, an electrically isolating material, such as SiO$_2$ or other appropriate trench fill material is deposited to cover one or more active regions in the substrate and to fill the trenches. The fill material is then planarized to expose a portion of the active regions of the substrate. This leaves a substantially planar top surface comprising the exposed portion of the substrate (e.g., in the active region or regions) and a remaining portion of the fill material in the trenches, by which electrical isolation regions are provided. Thereafter, one or more electrical devices may be formed in the active regions according to known device formation processes.

Planarizing the fill material may advantageously be done using a substantially self-stopping material removal process, such as recently developed fixed-abrasive CMP techniques, in which a fixed-abrasive polishing pad is employed in association with a slurry substantially free of abrasives to remove a top portion of the fill material. This may be followed by removal of a second portion of the fill material using a wet etch process to expose the substrate in the active regions and the remaining portion of the fill material in the trenches. Methods are also provided for isolating active regions from one another, and for providing shallow trench isolation between active regions in semiconductor devices according to further aspects of the invention. Thus, the invention may be employed to provide a planar post polish topography.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
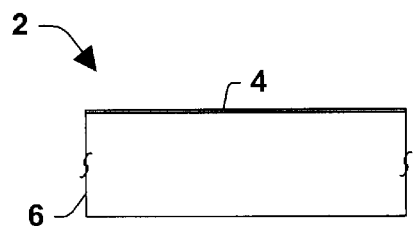
FIGS. 1A–1G are partial side elevation views in section illustrating a portion of a conventional shallow trench isolation process for providing isolation between adjacent electrical devices in a semiconductor wafer.
Figure 1B:
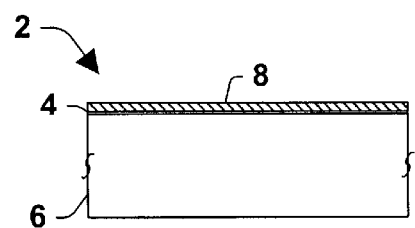
Figure 1C:
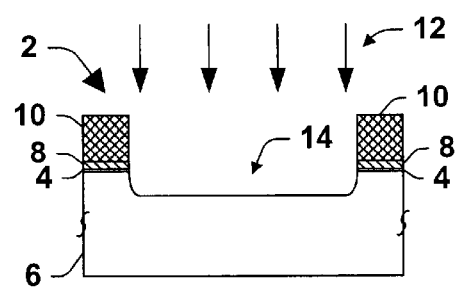
Figure 1D:
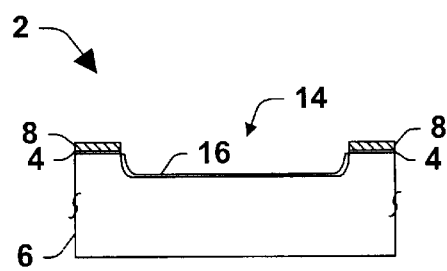
Figure 1E:
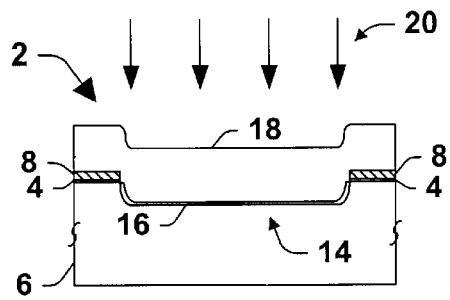
Figure 1F:
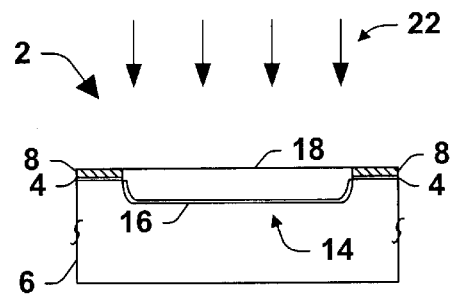

The present invention will now be described with reference to the drawings wherein like reference numerals are used to refer to like elements throughout. The invention may be employed to avoid or mitigate STI trench fill material step heights associated with previous isolation processes. This, in turn, allows improved control over critical dimensions (CDs) associated with lithographically patterned features in subsequently formed electrical devices, such as transistors and/or memory cells in a semiconductor product. The invention advantageously employs substantially self-stopping material removal processes such as fixed-abrasive CMP techniques or the like, which allows the protective nitride layer to be removed before trench filling. Thereafter, the CMP planarization provides a smooth planar surface substantially free of steps previously associated with STI trench fill material. Subsequent patterning, particularly of critical poly gate structures, can then be done without the misalignment and other inaccuracies or variances previously caused by such steps. The processes and methodologies of the invention may be advantageously employed in order to isolate any type of electrical devices in a semiconductor wafer, including but not limited to memory cells, transistors, and/or the like.

Figure 2:
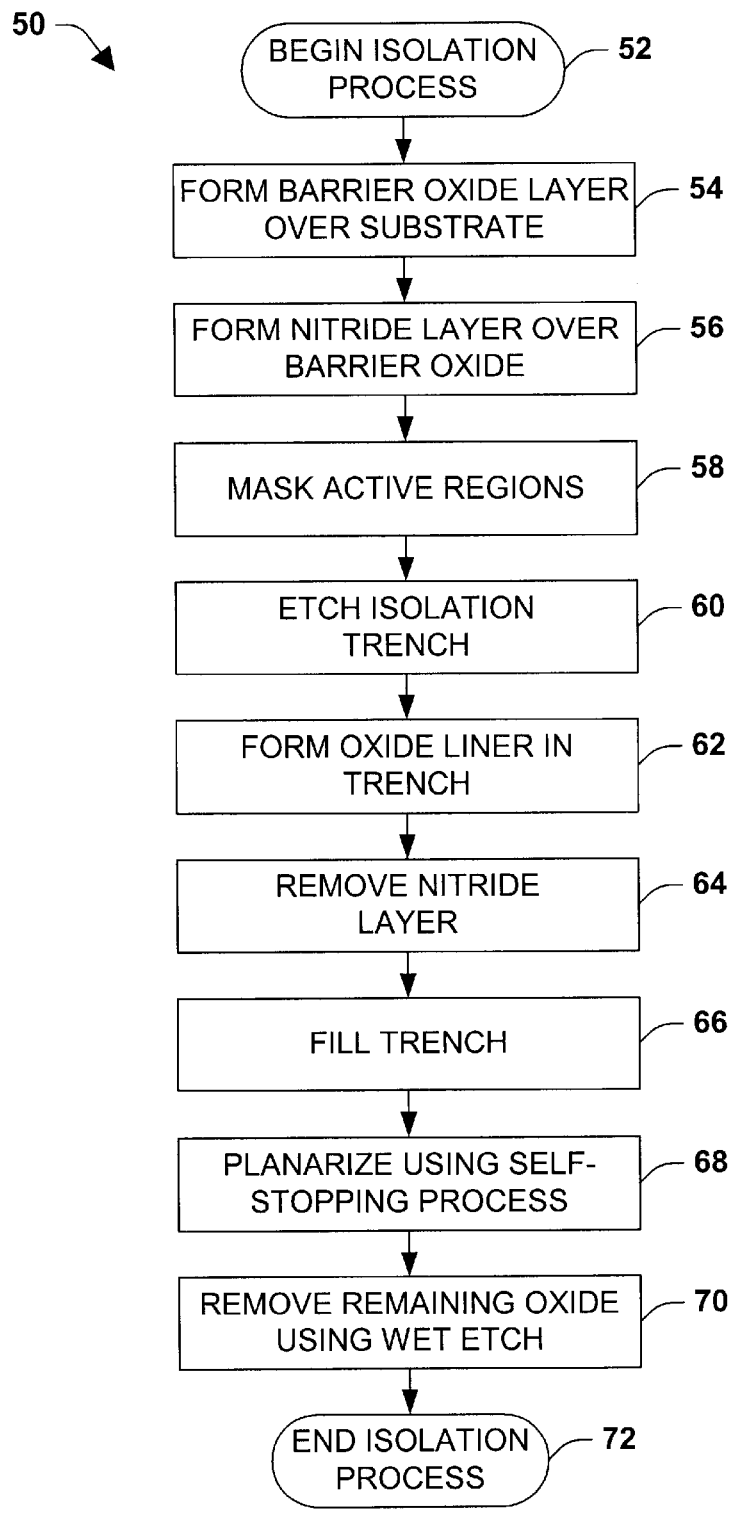
FIG. 2 is a flow diagram illustrating an exemplary method of fabricating semiconductor devices in accordance with the present invention.

Referring initially to FIG. 2, an exemplary method 50 is illustrated for fabricating semiconductor devices in accordance with the present invention, in which isolation trenches may be formed between active areas or regions in a semiconductor substrate. Although the method 50 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The isolation process or method 50 begins at 52, and a pad or barrier oxide layer is formed at 54. Any appropriate oxide formation technique may be employed at 54, for example, by placing the wafer in a thermally controlled oxidation ambient by which silicon dioxide (SiO$_2$) is formed to a controlled thickness, such as about 200–400 Å. At 56, a layer of nitride is then deposited on the wafer having any appropriate thickness, for example, about 200–2000 Å. The nitride layer formed at 56 may comprise a single layer, for example, Si$_3$N$_4$, or alternatively two layers such as a back anti-reflective coating (BARC) layer of SiON over a layer of SiN. In either case, the nitride material deposited at 56 may be any suitable nitride, such as SiN, Si$_3$N$_4$, silicon rich nitride, SiON, or others, by which protection can be afforded to the underlying substrate in active regions of the wafer during isolation trench formation. In addition, the nitride layer formed at 56 may provide anti-reflective characteristics useful for accurate patterned masking of active regions of the device prior to trench formation. The nitride layer formation at 56 may be performed using any known deposition technique, such as by low pressure chemical vapor deposition (LPCVD). After nitride layer formation at 56, isolation trenches are formed at 58–62 through the barrier oxide and nitride layers, and into the field or non-active regions of the substrate.

At 58, active regions of the wafer are selectively masked, leaving the field or isolation regions exposed. The masking at 58 may be done according to known photolithography methodologies, such as depositing a resist layer over the nitride layer, exposing select portions of the resist to a radiation source through a photomask, and removing either the exposed or the unexposed portions of the resist material so as to expose a portion of the nitride layer in the field regions and to leave the active regions covered. At 60, the isolation trench is etched using the patterned mask. The trench etch at 60 may be a multi-step etch process, by which material is removed in the exposed isolation regions so as to etch through the nitride layer, the underlying barrier oxide layer, and into the semiconductor substrate so as to form a trench. For instance, a first dry etch step may be employed at 60 to remove the nitride and oxide layers down to the silicon wafer surface, after which a second dry etch step is performed to remove the silicon surface area through the openings in the mask, creating the desired isolation trenches.

At 62, an oxide liner is formed over the exposed portions of the trench. The oxide liner can be formed in any appropriate manner, such as through thermal oxide growth, wherein the remainder of the nitride layer prevents oxidation in the active regions while oxide is grown in the exposed trench of the isolation regions to form the liner. An additional isolation implant can optionally be performed at the base of trench. For example, where the bulk substrate includes p-type silicon in which where n-channel transistor devices are to be formed, a p+ implant may be employed to provide further electrical isolation between electrical devices subsequently formed in active regions on either side of the resulting isolation trench, wherein such an implant would preferably be performed prior to removal of the trench etch mask.

In accordance with an aspect of the invention, the remaining portion of the nitride layer is then removed at 64, such as through selective wet etching. Thereafter at 66, an electrically isolating trench fill material is formed over the semiconductor substrate, covering the active regions and filling the trenches. The trench fill operation at 66 may comprise any appropriate deposition process, such as depositing SiO$_2$, or other appropriate isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS). However, it is to be appreciated that any deposition process may be employed at 66, and that other fill materials and deposition processes are contemplated as falling within the scope of the invention.

The method 50 further comprises planarizing the wafer at 68 to expose a portion of the substrate in active regions, and to provide a substantially planar top surface comprising the exposed substrate and a remaining portion of the fill material in the trench. In this manner, the remaining portion of the fill material forms an electrical isolation region or structure in the trench. Any remaining oxide may optionally be removed at 70, for instance, using a wet etch process, before the method 50 ends at 72. Following the isolation process 50, electrical devices such as transistors, memory cells, or others may be formed in the active regions according to known semiconductor processing methodologies.

In accordance with another aspect of the invention, substantially self-stopping material removal techniques may be advantageously employed at 68 and 70 so as to planarize the wafer. In one implementation, the planarization comprises removing a top portion of the fill material using a substantially self-stopping material removal process at 68, and removing a second portion of the fill material using a wet etch process at 70, so as to expose the active regions of the substrate and the remaining portion of the fill material in the trenches.

The removal of the top portion of fill material at 68 is preferably performed by chemical mechanical polishing the fill material using a fixed-abrasive polishing pad and a slurry substantially free of abrasives, such as using processes and equipment supplied or developed by the 3M company and Rodel of Newark, Del. and/or equivalents thereof. Although the exemplary method 50 involves the wet etch process at 70 to remove remaining oxide material, the fixed-abrasive CMP process at 68 may be employed so as to complete the planarization without requiring the wet etch at 70. In either situation, the resulting wafer top surface is substantially planar, providing improved control over critical dimensions of subsequently patterned electrical devices, due to the elimination or mitigation of step features related to STI isolation trench structures.

Figure 3:
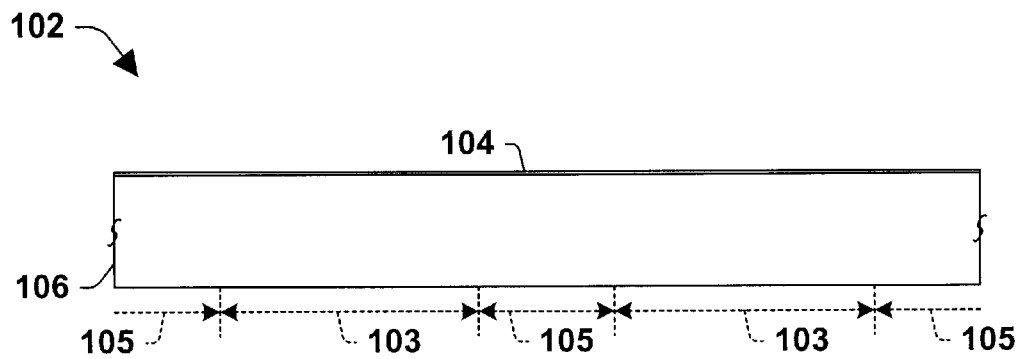
FIG. 3 is a partial side elevation view in section illustrating a semiconductor wafer processed according to the various aspects of the invention, wherein a barrier oxide layer is being formed thereon.
Figure 4:
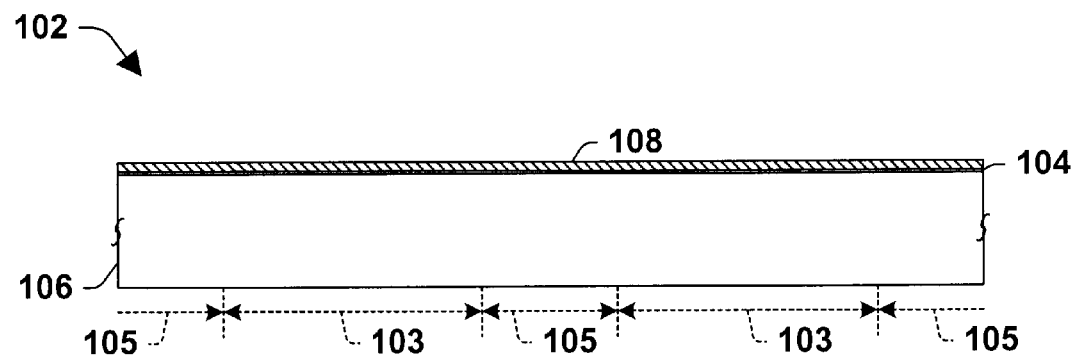
FIG. 4 is a partial side elevation view in section illustrating formation of a nitride layer in the semiconductor wafer of FIG. 3.

FIGS. 3–12 further illustrate the various aspects of the invention, wherein a semiconductor wafer 102 is processed generally according to the exemplary method 50 described above. It is noted at this point that the illustrations provided in FIGS. 3–12 are not necessarily drawn to scale. The wafer 102 comprises a semiconductor substrate 106, such as silicon partitioned into active regions 103 in which electrical devices (e.g., transistors, memory cells, or the like) are to be fabricated, and field or isolation regions 105 in which STI isolation structures are to be formed to isolate the electrical devices from one another. In FIG. 3, a thermal oxidation process (not shown) is employed to grow a barrier or pad oxide layer 104 (e.g., approximately 200–400 Å thick) over the top surface of the substrate 106. A nitride layer 108 is then is then deposited in FIG. 4, such as by low pressure chemical vapor deposition (LPCVD) of SiN, $Si_3N_4$, silicon rich nitride, SiON, or others having a thickness, for example, of about 100–500 Å, although any thickness may be employed in a range, for example, of about 100–2000 Å. The nitride layer 108 comprises a single layer structure, although multi-layer structures may alternatively be employed.

Figure 5:
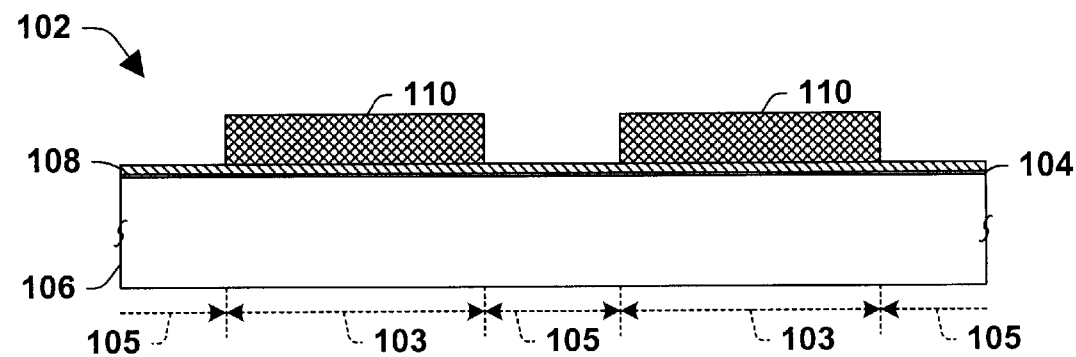
FIG. 5 is a partial side elevation view in section illustrating an active mask used to define active and isolation regions in the wafer.
Figure 6:
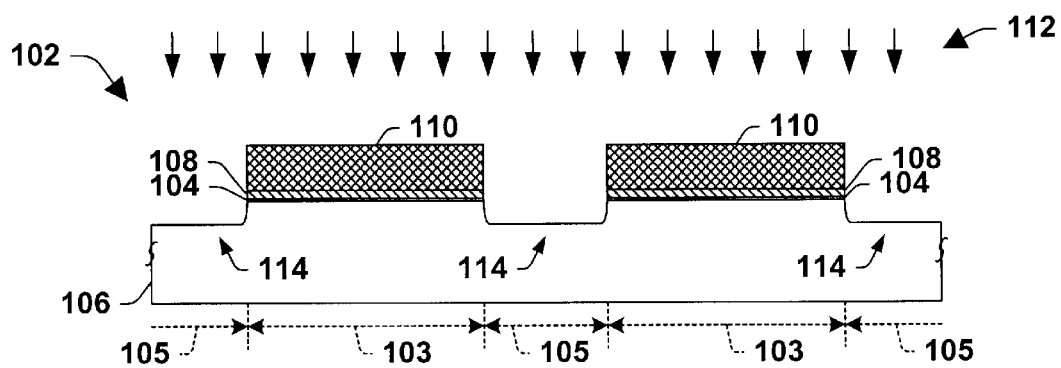
FIG. 6 is a partial side elevation view in section illustrating formation of isolation trenches in the wafer using an etch process.

In FIG. 5, the active regions 103 of the device 102 are masked using a patterned etch mask 110 such as an exposed and developed photoresist, leaving the nitride layer 108 exposed in the isolation regions 105. Thereafter in FIG. 6, a dry etch process 112 is employed to etch through the nitride layer 108, the pad oxide 104, and into the substrate 106 to form trenches 114 in the exposed isolation regions 105. As discussed above with respect to step 60 of the method 50 in FIG. 2, the etch process 112 may comprise a multi-step etch process, by which material is removed in the exposed isolation regions 105 so as to etch through layers 108 and 104, and into the semiconductor substrate 106 so as to form the trenches 114. In one example, a first etch may be employed in process 112 to remove the nitride and oxide layers 108 and 104, respectively, in the isolation regions 105. Process 112 may further comprise a second etch to remove the silicon from the substrate 106 so as to create the isolation trenches 114 in the regions 105.

Figure 7:
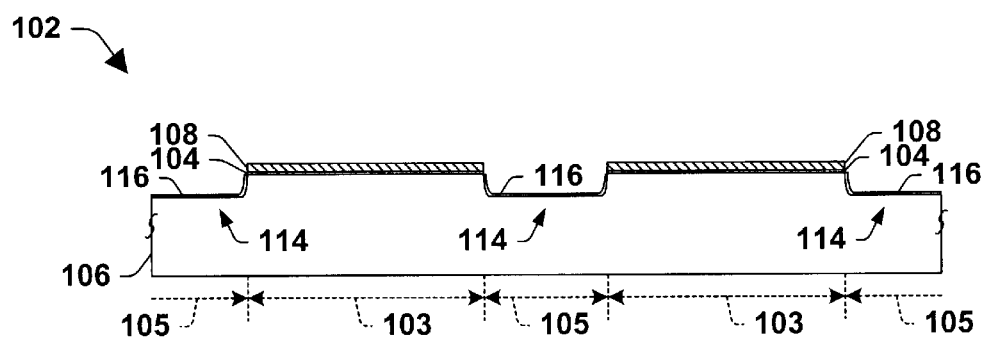
FIG. 7 is a partial side elevation view in section illustrating formation of a liner layer in the etched isolation trenches.
Figure 8:
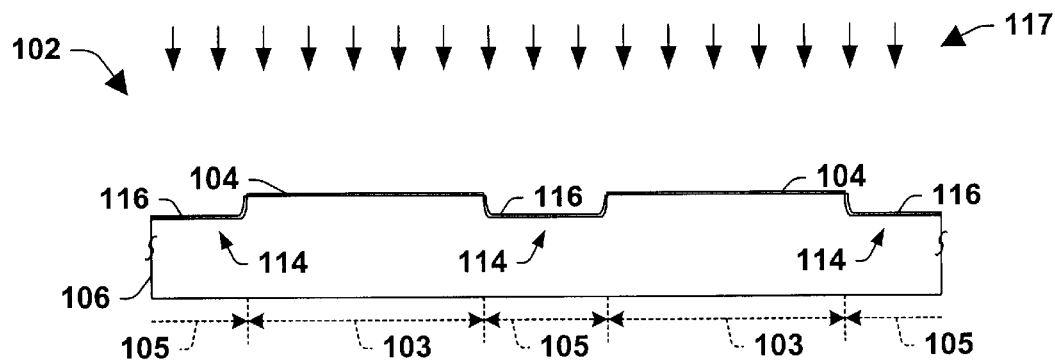
FIG. 8 is a partial side elevation view in section illustrating removal of the nitride layer prior to trench filling.
Figure 9:
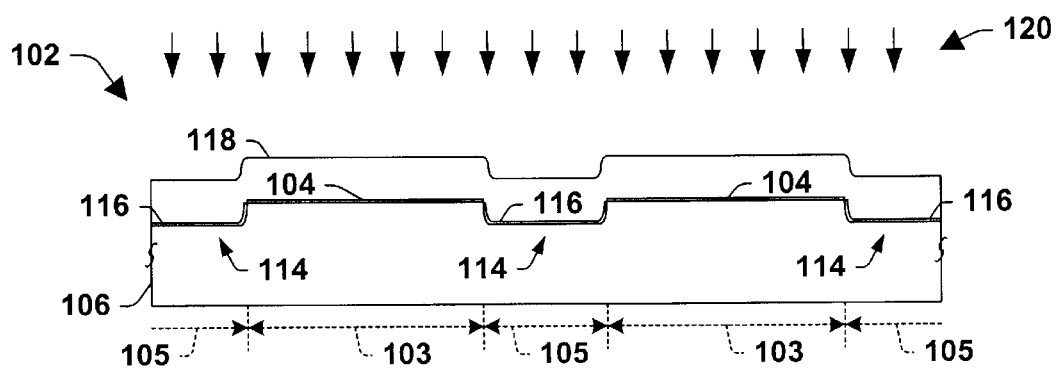
FIG. 9 is a partial side elevation view in section illustrating deposition of trench fill material.

In FIG. 7, the active mask 110 is removed and a liner 116 is formed in the trench 114, such as through thermal oxidation of the exposed portions of the trench 114. In accordance with the present invention, the nitride layer 108 is then removed, for example, using a wet etch process 117 in FIG. 8 prior to trench filling. Following the nitride layer removal, the trenches 114 are filled in FIG. 9 with electrically isolating material 118 such as via a deposition process 120. The process 120 may involve any appropriate deposition methodologies as are known, such as depositing $SiO_2$ or other isolating material 118 using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials 118 and deposition processes 120 are contemplated as falling within the scope of the appended claims.

Figure 10:
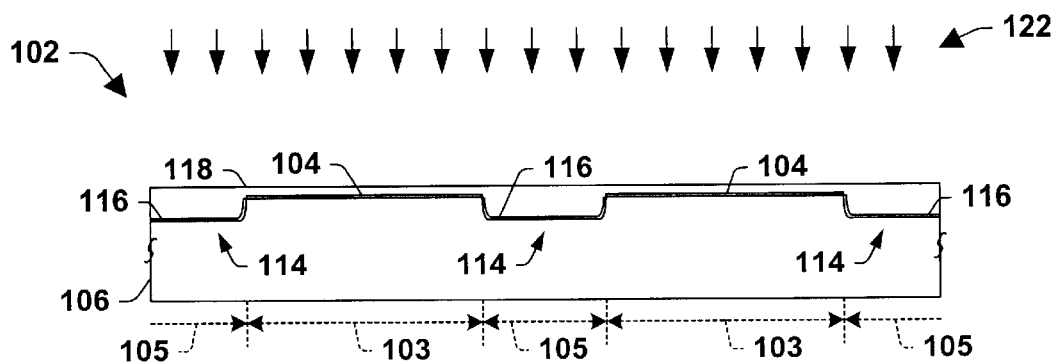
FIG. 10 is a partial side elevation view in section illustrating a fixed-abrasive CMP process for removal of a top portion of the deposited fill material.
Figure 11:
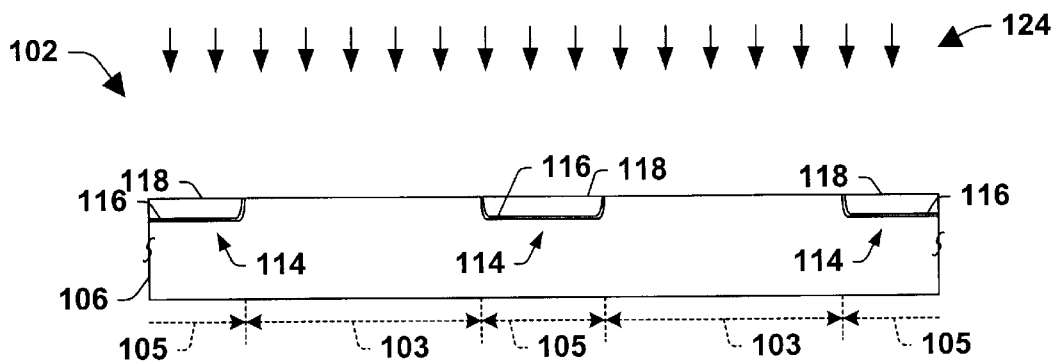
FIG. 11 is a partial side elevation view in section illustrating a wet etch process removing a second portion of the fill material to provide a substantially planar top surface.

In FIG. 10, a self-stopping material removal process 122, such as fixed-abrasive CMP polishing using a substantially abrasive-free slurry, is performed to remove at least a top portion of the fill material 118. The inventors have appreciated that fixed-abrasive CMP processing as developed by the 3M company and Rodel of Newark, Del. or the like provide substantially self-stopping planarization compared with previous CMP techniques using slurries with abrasive particles therein. In conventional CMP using conventional "silica" abrasive slurries, nitride layers were maintained throughout planarization to act as a CMP stop layer. This was due to the non-self-stopping nature of abrasive-slurry CMP processes, wherein movement of the abrasive particles continues to polish even where the polishing pad is no longer forced toward the wafer, because the abrasive particles keep moving around in the slurry.

However, the employment of fixed-abrasive CMP polishing with abrasive-free slurries in the process 122 allows planarization without the nitride layer 108. The exemplary process 122 advantageously employs fixed-abrasive polishing pads, wherein abrasive particles are fixed in the pad, rather than dispensed within a slurry, as illustrated and described further below with respect to FIGS. 13A and 13B. In particular, it is believed that in fixed-abrasive CMP processing, the chemical contribution to material removal is much less than was the case in abrasive-slurry CMP. As a result, it is believed that the amount of polishing can be controlled to a degree not previously achievable, by which a nitride stop layer is no longer needed during planarization. Consequently, the step height associated with the nitride layer is no longer a problem with the present invention. Although the implementations illustrated and described herein take advantage of the self-stopping nature of fixed-abrasive type CMP processes, it will be appreciated that other self-stopping or substantially self-stopping material removal processes can be employed for planarization in accordance with the present invention and that all such processes and equivalents thereof are contemplated as falling within the scope of the appended claims.

Figure 1G:
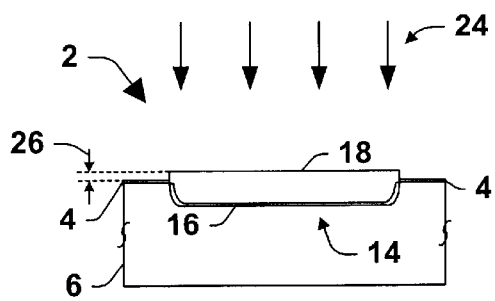
Figure 12:
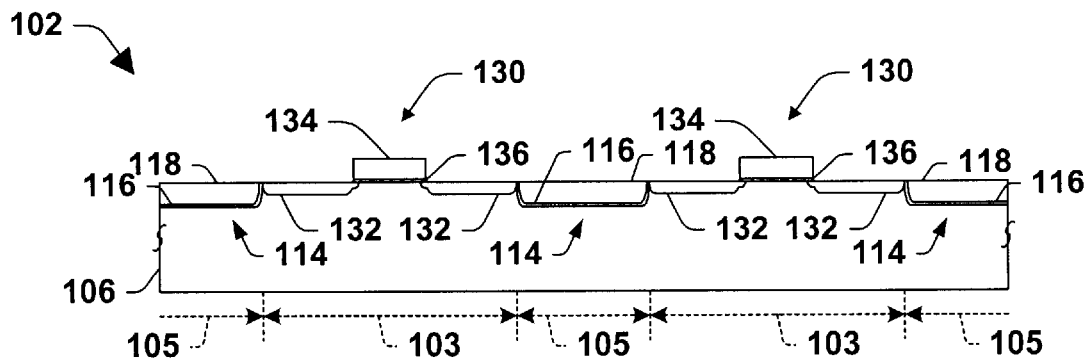
FIG. 12 is a partial side elevation view in section illustrating transistor devices formed in the active regions between isolation trenches of the wafer.

The process 122 may be used to complete the planarization, or alternatively may be employed to remove the top portion of the fill material 118, as illustrated in FIG. 10. In this case, a second portion of the fill material 118 is removed in FIG. 11 via a wet etch process 124 so as to expose the top surface of the substrate 106 in the active regions 103 and the remaining portion of the fill oxide 118 in the trenches 114. It is noted in FIG. 11 that the invention allows significant reduction or virtual elimination of the step height previously experienced in STI isolation processes, by which lithographic pattern transfer can be facilitated in subsequent processing steps. Referring also to FIG. 12, one or more electrical devices may thereafter be formed on or in the active regions 103 of the wafer 102, such as MOS type transistors 130 having source/drain regions 132, and polysilicon gate contact structures 134 overlying thin gate oxide layers 136 using known semiconductor processing techniques. It will be appreciated that the provision of the substantially planar surface following the planarization of FIGS. 10 and 11 facilitates the formation of the electrical devices 130, and in particular allows the critical dimensions of the poly gate structure 134 to be controlled more accurately and repeatably than was possible with the step heights found in the prior art (e.g., FIG. 1G above).

Figure 13A:
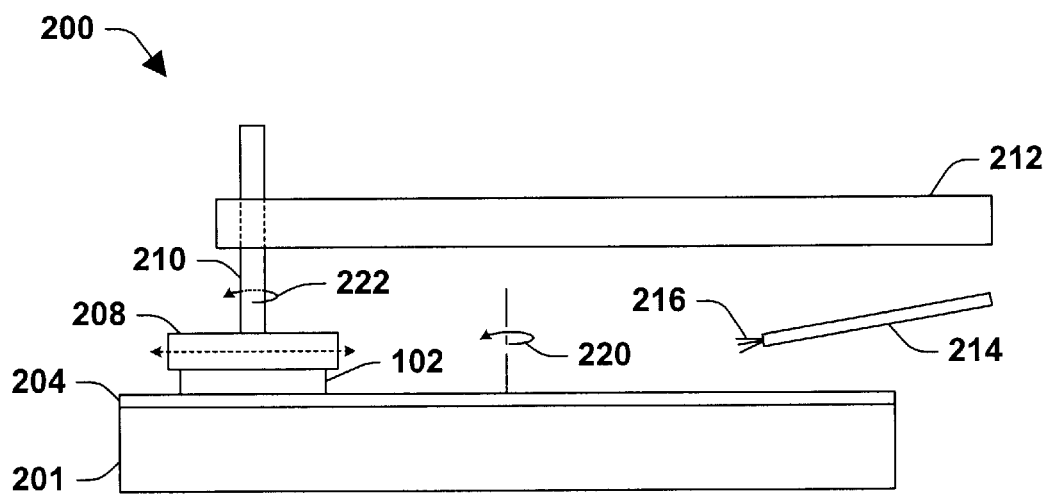
FIG. 13A is a partial side elevation view illustrating a fixed-abrasive CMP processing system according to an aspect of the present invention.
Figure 13B:
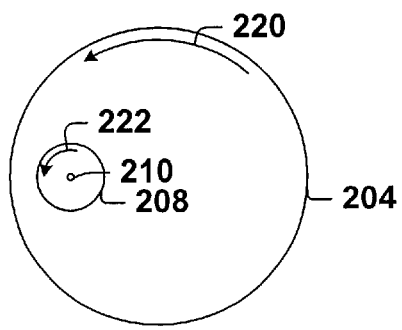
FIG. 13B is a partial top plan view further illustrating the CMP system of FIG. 13A.

Referring now to FIGS. 13A and 13B, a typical CMP apparatus or system 200 is illustrated in which the self-stopping fixed-abrasive CMP processing described above may be carried out for STI processing of the wafer 102. The system 200 comprises a rotatable platen 201 and a polishing pad 204 mounted on the platen 201, which may be rotatably driven by a control motor (not shown) to rotate at a controlled speed, for example, about 10 to about 100 RPM. The pad 204 advantageously comprises abrasive particles fixed therein for polishing in association with essentially abrasive-free slurries. The wafer 102 is mounted on the bottom of a rotatable carrier assembly 208 so that a major surface of the wafer 102 to be polished is positionable to contact the underlying polishing pad 204. The wafer 102 and the carrier assembly 208 arc attached to a vertical spindle 210 which is rotatably mounted in a lateral arm 212.

The spindle 210 operates to rotate the carrier assembly 208 at a controlled speed, such as about 10 to about 75 RPM, in the same direction as that of the platen 201, and further radially positions the carrier assembly 208 on the platen 201. The arm 212 also vertically positions carrier assembly 208 so as to position the wafer 102 in contact with the polishing pad 204, and maintains an appropriate polishing contact pressure. Once the pressure subsides, the process essentially stops removing material from the wafer 102, as the slurry contains no abrasive particles. Thus, the primary material removal is due to contact between the pad 204 and the wafer 102. A tube 214 is located opposite the carrier assembly 208 and above the polishing pad 204 to dispense and evenly saturate the pad 204 with an appropriate cleaning agent 216, such as an abrasive-free slurry. As further illustrated in FIG. 13B, the polishing pad 204 rotates in the direction of arrow 220, while the carrier assembly 208 rotates in the direction of arrow 222, similar to the direction of arrow 220, but at a different speed than the polishing pad 204, while a downward force is applied to the carrier assembly 208 via the spindle 210 in a direction perpendicular to carrier assembly 208.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method for fabricating semiconductor devices in a semiconductor substrate, comprising:

forming a nitride layer over a semiconductor substrate;

forming at least one trench through the nitride layer and into the semiconductor substrate;

removing the nitride layer;

forming an electrically isolating material over the semiconductor substrate after removing the nitride layer, the electrically isolating material covering at least one active region in the semiconductor substrate and filling the at least one trench;

removing at least a top portion of the electrically isolating material using a first material removal process;

removing a second portion of the electrically isolating material using a second material removal process so as to expose a portion of the semiconductor substrate in at least one active region and the remaining portion of the electrically isolating material in the at least one trench, the remaining portion of the electrically isolating material forming an electrical isolation region in the at least one trench; and forming an electrical device in the at least one active region.

2. The method of claim 1, wherein removing at least a top portion of the electrically isolating material comprises chemical mechanical polishing the electrically isolating material using a fixed-abrasive polishing pad and a slurry substantially free of abrasives.

3. The method of claim 2, wherein removing the second portion of the electrically isolating material comprises etching the second portion of the electrically isolating material using a wet etch process to expose the portion of the semiconductor substrate in the at least one active region.

4. A method for fabricating semiconductor devices in a semiconductor substrate, comprising:

forming a nitride layer over a semiconductor substrate;

forming at least one trench through the nitride layer and into the semiconductor substrate;

removing the nitride layer;

forming an electrically isolating material over the semiconductor substrate after the step of removing the nitride layer, the electrically isolating material covering at least one active region in the semiconductor substrate and filling the at least one trench;

planarizing the electrically isolating material by removing at least a portion of the electrically isolating material using a substantially self-stopping material removal process to expose a portion of the semiconductor substrate in at least one active region and a remaining portion of the electrically isolating material in the at least one trench, the remaining portion of the electrically isolating material forming an electrical isolation region in the at least one trench; and forming an electrical device in the at least one active region.

5. The method of claim 4, wherein removing at least a portion of the electrically isolating material using a substantially self-stopping material removal process comprises chemical mechanical polishing the electrically isolating material using a fixed-abrasive polishing pad and a slurry substantially free of abrasives so as to expose the portion of the semiconductor substrate in at least one active region and the remaining portion of the electrically isolating material in the at least one trench.

6. The method of claim 4, wherein removing at least a portion of the electrically isolating material using a substantially self-stopping material removal process comprises:

removing at least a top portion of the electrically isolating material using a substantially self-stopping material removal process; and removing a second portion of the electrically isolating material using a second material removal process so as to expose the portion of the semiconductor substrate in at least one active region and the remaining portion of the electrically isolating material in the at least one trench.

7. The method of claim 6, wherein removing at least a top portion of the electrically isolating material comprises chemical mechanical polishing the electrically isolating material using a fixed-abrasive polishing pad and a slurry substantially free of abrasives.

8. The method of claim 7, wherein removing the second portion of the electrically isolating material comprises etching the second portion of the electrically isolating material using a wet etch process to expose the portion of the semiconductor substrate in the at least one active region.

9. The method of claim 6, wherein removing the second portion of the electrically isolating material comprises etching the second portion of the electrically isolating material using a wet etch process to expose the portion of the semiconductor substrate in the at least one active region.

10. The method of claim 6, wherein forming the electrically isolating material comprises depositing $SiO_2$ using one of a high density plasma oxide deposition process and a chemical vapor deposition process.

11. The method of claim 6, further comprising forming an oxide layer on the semiconductor substrate prior to forming the nitride layer.

12. The method of claim 6, wherein forming the at least one trench comprises:

forming a mask over the nitride layer;

patterning the mask so as to expose a portion of the nitride layer in the electrical isolation region and to leave the at least one active region covered; and etching through the nitride layer and into the semiconductor substrate so as to form the at least one trench in the electrical isolation region.

13. The method of claim 6, further comprising forming a liner oxide layer over the exposed portions of the at least one trench prior to removing the nitride layer.

14. A method of providing shallow trench isolation between active regions in a semiconductor device, comprising:

forming at least one trench through a nitride layer and an underlying semiconductor substrate in an isolation region between first and second active regions in the semiconductor device;

removing the nitride layer;

filling the at least one trench with an oxide material after removing the nitride layer; and planarizing the oxide material so as to expose a portion of the semiconductor substrate in the active regions, and to provide a substantially planar top surface comprising the exposed portion of the semiconductor substrate and a remaining portion of the oxide material in the at least one trench, wherein planarizing the oxide material comprises:

chemical mechanical polishing at least a top portion of the oxide material using a fixed-abrasive polishing pad and a slurry substantially free of abrasives; and removing a second portion of the oxide material using a second material removal process so as to expose the portion of the semiconductor substrate in the active regions and the remaining portion of the oxide material in the at least one trench.

15. The method of claim 14, wherein removing the second portion of the oxide material comprises etching the second portion of the oxide material using a wet etch process to expose the portion of the semiconductor substrate in the active regions.

16. The method of claim 1, wherein the first material removal process is substantially self-stopping.

17. The method of claim 16, wherein the first material removal process comprises chemical mechanical polishing the electrically isolating material using a fixed-abrasive polishing pad and a slurry substantially free of abrasives.

* * * * *